United States Patent [19]
DeCrosta et al.

[11] Patent Number: 5,279,850
[45] Date of Patent: Jan. 18, 1994

[54] GAS PHASE CHEMICAL REDUCTION OF METALLIC BRANDING LAYER OF ELECTRONIC CIRCUIT PACKAGE FOR DEPOSITION OF BRANDING INK

[75] Inventors: David A. DeCrosta; Jack H. Linn, both of Melbourne; Martin E. Walter, Palm Bay, all of Fla.

[73] Assignee: Harris Corporation, Melbourne, Fla.

[21] Appl. No.: 913,844

[22] Filed: Jul. 15, 1992

[51] Int. Cl.$^5$ .............................................. C23C 26/00
[52] U.S. Cl. .............................. 427/58; 427/96; 427/309
[58] Field of Search ..................... 427/58, 309, 96

[56] References Cited
U.S. PATENT DOCUMENTS

| | | | |
|---|---|---|---|
| 3,647,532 | 3/1972 | Friedman | 427/96 |
| 3,827,918 | 8/1974 | Ameen | 427/96 |
| 4,457,861 | 7/1984 | Des Marais | 427/96 |
| 4,479,890 | 10/1984 | Prabhu | 427/96 |
| 4,511,601 | 4/1985 | Akse | 427/96 |
| 4,964,923 | 10/1990 | Takeuchi | 427/96 |
| 5,009,926 | 4/1991 | Fukuda | 427/58 |
| 5,024,734 | 6/1991 | Downs | 427/96 |

Primary Examiner—Shrive Beck
Assistant Examiner—Vi Duong Dang
Attorney, Agent, or Firm—Charles E. Wands

[57] ABSTRACT

A process for removing unwanted contaminant metallic oxide from the surface of a nickel branding layer of an electronic circuit package, in order to enhance the affinity of a layer of phenolic branding ink to the surface of the metallic branding layer involves treating the surface of the metallic branding layer with a hydrogen-containing, chemical reducing gas phase ambient, so that oxygen within the surface oxide chemically combines with the hydrogen component within the ambient, so as to form readily removable water. The surface of the metallic branding layer is thereby substantially free of surface oxide, providing a greater surface area of metallic-ink bonding sites. As a consequently, a subsequently deposited layer of branding ink strongly adheres to the surface of the nickel and is not readily removed during further cleaning of the circuit package.

20 Claims, 1 Drawing Sheet

GAS PHASE CHEMICAL REDUCTION OF METALLIC BRANDING LAYER OF ELECTRONIC CIRCUIT PACKAGE FOR DEPOSITION OF BRANDING INK

FIELD OF THE INVENTION

The present invention relates in general to the manufacture of electronic circuits and is particularly directed to a process for removing unwanted contaminant material (passivating oxide) from the surface of a metallic (e.g. nickel) branding layer of an electronic circuit package by means of a hydrogen-containing reducing agent, in order to enhance the affinity of a layer of additional material (e.g. phenolic branding ink) to the surface of the metallic branding layer.

BACKGROUND OF THE INVENTION

The manufacture of electronic circuit components and the packaging of those components customarily involves the deposition of one or more layers of material upon a base element or substrate. During the manufacturing process it is occasionally necessary to subject the component to a cleansing purge to remove unwanted contaminants that may have formed in a previous process step and to prepare the part for the formation of additional material on one or more selected sites. For example, to maximize the metallurgical affinity of solder (diagrammatically shown at 11 in FIG. 1) to an electrode terminal 13, the terminal metal should be free of surface contaminant material (e.g. oxide and organics) 15, before application of the solder. Similarly, with reference to the diagrammatic illustration of an electronic circuit package 20 in FIG. 2, prior to depositing a layer of 'branding code' ink 21 to the surface 23 of a metallic (e.g. nickel) branding lid 25, it is necessary to clean the surface of the metallic branding lid 25, in order ensure that the ink will strongly adhere to the lid and tolerate various solvents that are used to clean the part before and after it is eventually soldered in place on an electrical circuit board.

Conventional branding techniques on nickel-plated circuit packaging lids involve the use of a number of ink supplier-recommended wet chemical etching solutions, such as Markum 535, Markum 310, IPA, which have been accepted by the industry as being effective in removing oxide and organic contaminants, thereby sufficiently increasing the surface energy of the lid to the adherence of the ink to meet MIL-STD testing compliance for brand permanency. In effect, the chemical solution physically etches away the surface of the lid and thereby removes surface oxide and organics down to some level of 'clean' metal, in order that the number of uncontaminated nickel bonding sites will be increased.

Unfortunately, chemical etching solutions have a significant drawback, - the entire circuit package is immersed in the etching solution in order to clean or etch the oxide contaminants off the lid. As a consequence, the solution not only cleans the lid, but, because of its substantial caustic properties (Markum 535, for example, contains monoethanolamine which has a pH greater than ten), it etches or physically attacks other portions of the package, such as the soldered leads, the lid-to-seal ring weld area, and various plated metallic markings or codes on the package, as well as the ceramic package itself. It has been found that this ancillary etch not only degrades the cosmetic appearance of the part, but may detrimentally affect its overall reliability. Moreover, upon completion of the chemical etch, because the package is subjected to an oven drying step at an elevated temperature, following a rinse, oxide again begins to immediately form on the 'cleaned' surface of the nickel. As a result, when the part emerges from the drying oven, time is of the essence for successfully depositing the branding ink, which must ordinarily conducted within minutes of the oven drying step.

SUMMARY OF THE INVENTION

In accordance with the present invention, rather than chemically etch away some thickness of contaminant-containing material from the surface of a metallic layer upon which additional material, such as part identification branding code ink, is to be deposited, which not only subjects other portions of the circuit package to physical degradation, but still requires that the branding metal be 'inked' within a very short time window, the contaminant material is electrochemically extracted from the surface of the metal by an oxidation-reduction reaction. Specifically, the gas phase metal surface preparation process according to the present invention employs a hydrogen-containing chemical reducing ambient to which the metal surface is exposed in a controlled ambient furnace at a moderately elevated temperature. The hydrogen component within the ambient combines with the contaminating oxygen of the surface oxide layer to form readily removable water, while leaving the surface of the metallic branding layer substantially free of surface oxide. What results is a nearly pure metallic surface in which the oxidation state of the metallic atoms is not altered, and which remains in chemical equilibrium for a period of time considerably longer than the case of using a wet chemical etch. After the reduction process, the temperature of the treated surface is ramped down to room temperature before leaving the furnace, so as to minimize its tendency to readily oxidize with external air. As a result, over a considerably longer branding time window, a greater surface area of metallic-ink bonding sites is available, so that the branding ink strongly adheres to the surface of the metallic branding layer and is not readily removed during subsequent cleaning of the circuit package.

The electrochemical reducing process of the present invention also has utility in the preparation of solder metalization sites of printed circuit boards, as it readily extracts oxide contaminants, while leaving the lead attachment metal intact. The process for treating a printed circuit board in preparation for a soldering step is the same as that of preparing the branding metal of a printed circuit package. The printed circuit board is fed into a controlled ambient furnace to which a hydrogen-containing reducing ambient is supplied under positive pressure, so as to cause the reducing agent to chemically react with metallic oxide on the surface of the patterned metal. Oxygen in the metallic oxide combines with the hydrogen to form water that is readily purged, leaving the surface of the metal pattern substantially free of metallic oxide, thereby allowing solder to readily adhere to it. The temperature of the board is then ramped down so as to lower the temperature of the patterned metal to room temperature in the presence of the ambient prior to removing the printed circuit board from the furnace.

DETAILED DESCRIPTION

As pointed out briefly above, the oxide contaminant removal process of the present invention involves treating the surface of the metallic branding layer with a hydrogen-containing, chemical reducing gas phase ambient, so that oxygen within the surface oxide chemically combines with the hydrogen component within the ambient to form water, which is non-toxic and easily removed. The surface of the metallic branding layer is thereby rendered substantially free of surface oxide, so that it provides a greater surface area of metallic-ink bonding sites. Consequently, branding ink strongly adheres to the surface of the metallic branding layer and is not readily removed during subsequent cleaning of the circuit package.

Figure 1:
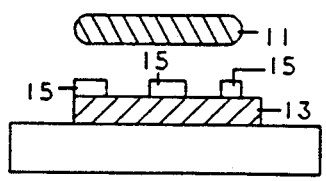
FIG. 1 diagrammatically illustrates an electrode terminal to which solder is to be applied.
Figure 2:
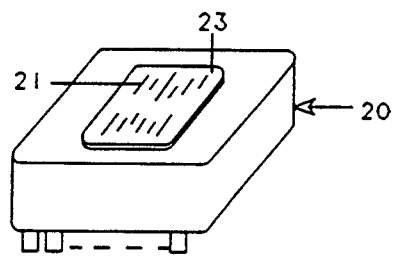
FIG. 2 is a diagrammatic illustration of an electronic circuit package having a metallic branding lid to which a layer of branding ink is to be deposited.
Figure 3:
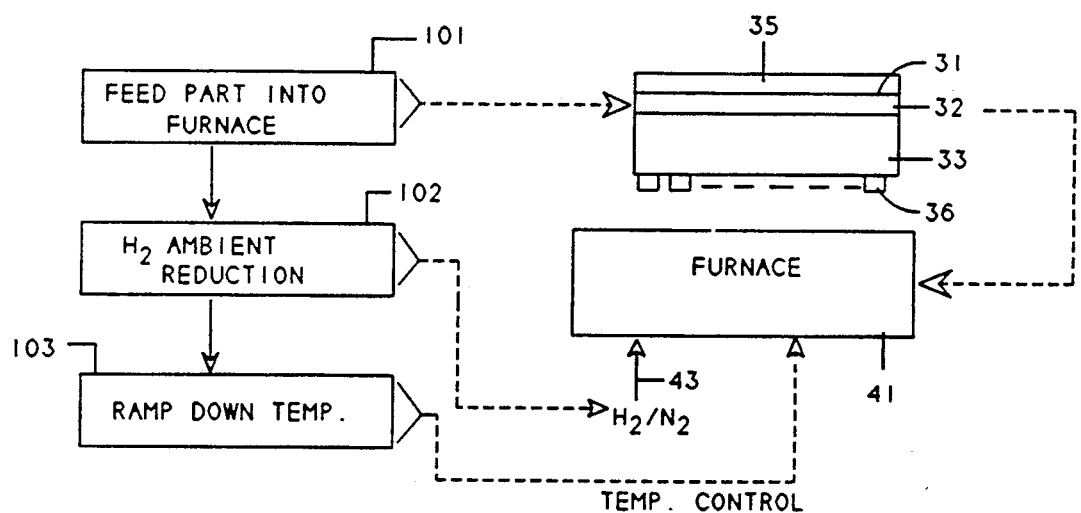
FIG. 3 diagrammatically shows a metal surface preparation process flow according present invention employing a hydrogen-containing chemical reducing ambient to extract contaminating oxygen from a surface metallic oxide layer.

FIG. 3 diagrammatically shows a metal surface preparation process flow in accordance with an embodiment of the present invention for treating the surface 31 of a metal (e.g. nickel) plated lid 32 of an electronic circuit package 33 in preparation for the deposition of a layer of branding code ink used to identify the part. The process employs a controlled ambient furnace, shown at 41, into which a hydrogen-containing ambient gas mixture 43 is supplied under pressure, to provide a positive gas flow during the course of the exposure of the package to the ambient. Preferably the ambient is a hydrogen/nitrogen mixture, the hydrogen content of which is at least ten percent and may range up to ninety percent or more by volume. While the nitrogen provides some degree of oxidation-buffering of the treated surface of the metal being reduced, it principally serves as a carrier within the ambient.

At an initial step 101 of the process, the electronic circuit package to be treated is fed into furnace 41 and the temperature is ramped up to a relatively moderately elevated temperature with a range of from 150° to 200° C. for a period of time on the order of 15 to 60 minutes. Because of this moderately elevated temperature range, previously conducted die attach curing of the part is not affected, since such curing is normally conducted at a temperature well above the upper end of the treatment range employed (200° C. in the present example). In addition, because there is no oxidant (oxygen gas or air) present in the controlled ambient, which has a positive gas flow, there is no potentially hazardous flame within the furnace.

During the exposure of the part to the hydrogen/nitrogen ambient, an oxidation-reduction chemical reaction takes place, in which oxygen atoms in a metallic oxide layer 35 of surface 31 combine with the hydrogen gas within the ambient, as shown at step 102, so as to form a compound (water) that is readily purged leaving the surface 31 of the nickel layer substantially free of nickel oxide. Namely, the nickel within the previous contaminating layer of nickel oxide remains in situ, but is now effectively devoid of oxygen atoms, so that the surface 31 of the nickel is substantially pure elemental nickel. Analysis of the composition and metallurgical properties of the reduced nickel have revealed trace amounts of nickel hydride. However, such hydride has not been found to reduce electronic energy within the nickel or to inhibit the strong affinity of ink to the treated surface. Instead, it is believed that such trace hydride serves to suppress reoxidation of the nickel surface, once it has been removed from the furnace at room temperature, as a package that has been treated using the process of the present invention has been found to maintain a strong ink adhesion energy for several hours (as contrasted with the only minutes availability for ink deposition on chemically etched surfaces).

Upon completion of the reduction process time interval, the temperature is ramped down to room temperature while the surface of the nickel remains exposed to the (oxygen-free) ambient, as shown at step 103. When the part exits the furnace, the surface of the nickel lid is not only oxide free, but it will not reoxidize as readily as in the case of a conventional chemical wet etch process, which uses an elevated temperature oven to dry the part (inherently causing the nickel to begin reoxidizing). As a result, over a considerably longer branding time window on the order of several hours, a greater surface area of metallic-ink bonding sites is available, so that branding ink will strongly adhere to the surface of the nickel branding layer and will not be so easily removed during subsequent cleaning of the circuit package.

In addition to enhancing the affinity of part identification code branding ink to the metallic (nickel) lid of the package, the gas phase electrochemical reducing methodology of the present invention also improves latent solderability of the package leads diagrammatically shown at 36, since these leads are also exposed to the reducing ambient. Consequently, oxide build-up on the leads may also be safely converted into harmless water vapor or droplets and expelled from the part, thereby allowing for much improved solder flow and reduced solder voiding.

This 'lead-preping' capability of the electrochemical reducing process of the present invention has particular utility in the preparation of solder metalization sites of printed circuit boards, as it readily extracts oxide contaminants while leaving the lead attachment metal intact. The process for treating a printed circuit board in preparation for a soldering step is the same as that of preparing the branding metal of a printed circuit package. Specifically, the printed circuit board is fed into a controlled ambient furnace to which a hydrogen-containing reducing ambient is supplied under positive pressure, so as to cause the reducing agent to chemically react with metallic oxide on the surface of the patterned metal. Oxygen in the metallic oxide combines with the hydrogen to form water that is readily purged, leaving the surface of the metal pattern substantially free of metallic oxide, thereby allowing solder to readily adhere to it. The temperature of the board is then ramped down so as to lower the temperature of the patterned metal to room temperature in the presence of the ambient prior to removing the printed circuit board from the furnace.

As will be appreciated from the foregoing description, the reducing process according to the present invention provides a nearly pure metallic surface in which the oxidation state of the metallic atoms is not altered, and which remains in chemical equilibrium for a period of time considerably longer than the case of using a chemical etch. Also with the temperature of the treated nickel surface being ramped down to room temperature before leaving the furnace, any tendency of the nickel to readily oxidize with external air is further suppressed. As a result, over a substantial branding time window of several hours in duration, a greater surface area of metallic-ink bonding sites is available, so that the branding ink strongly adheres to the surface of the metallic branding layer and is not readily removed during subsequent cleaning of the circuit package. Moreover, since the by-product of the reduction process is water, special environmental safeguards for toxic or hazardous waste disposal are unnecessary.

While we have shown and described an embodiment in accordance with the present invention, it is to be understood that the same is not limited thereto but is susceptible to a variety of changes and modifications that will be readily appreciated by a person skilled in the technology. For example, while the above description explains the application of the process of the invention to the electrochemical reduction of nickel oxide, it should be understood that the inventive process may be applied to the treatment of other metals, such as aluminum, iron, tungsten, copper and gold, for example, typically employed in the manufacture of electronic circuit components. Consequently, we do not wish to be limited to the details shown and described herein but intend to cover all such changes and modifications that are apparent to one of ordinary skill in the art.

What is claimed:

1. An electronic circuit manufacturing process comprising the steps of:
    (a) providing an electronic circuit part having a metallic layer upon a surface of which a layer of additional material is to be formed; and
    (b) prior to the formation of said layer of additional material on the surface of said metallic layer, removing unwanted adhesion-impairing contaminant material from said surface of said metallic layer and thereby increasing the surface area of available bonding sites for bonding said layer of additional material to said surface of said metallic layer, so as to enhance effective adhesion energy between said surface of said metallic layer and said layer of additional material and thereby enable said layer of additional material to strongly adhere to said surface of said metallic layer, by subjecting said surface of said metallic layer to a chemical reducing ambient, so that said unwanted adhesion-impairing contaminant material chemically combines with a substance within said ambient and is thereby extracted from said metallic layer, leaving the surface of said metallic layer substantially free of said unwanted adhesion-impairing contaminant material, and thereby enabling said layer of additional material to readily adhere to the resulting contaminant-free surface of said metallic layer.

2. A process according to claim 1, wherein said unwanted contaminant material comprises an oxide of said metallic layer formed on said surface of said metallic layer.

3. A process according to claim 2, wherein said chemical reducing ambient includes hydrogen.

4. A process according to claim 2, wherein said chemical reducing ambient comprises a mixture of hydrogen and nitrogen.

5. A process according to claim 1, further including the step (c) of, after removal of said unwanted adhesion-impairing contaminant material from the surface of said metallic layer in step (b), forming a layer of ink as said layer of additional material on said surface of said metallic layer.

6. A process according to claim 1, further including the step (c) of, after removal of said unwanted adhesion-impairing contaminant material from the surface of said metallic layer in step (b), forming a layer of solder as said layer of additional material on said surface of said metallic layer.

7. A process according to claim 1, wherein said metallic layer contains a metal selected from the group consisting of nickel, copper, gold, tungsten and aluminum.

8. A process according to claim 1, wherein step (b) comprises bringing the temperature of the surface of said metallic layer and said chemical reducing ambient to a temperature in a range from 150° to 200° C. for a prescribed period of time.

9. A process according to claim 8, wherein said chemical reducing ambient comprises a gaseous mixture of nitrogen and ten percent or more of hydrogen.

10. A process of preparing the surface of a metallic branding layer of an electronic circuit package for the deposition of a layer of branding ink comprising the steps of:
    prior to the deposition of said layer of branding ink on the surface of said metallic branding layer,
        (a) placing said electronic circuit package in a controlled ambient furnace; and
        (b) removing an unwanted adhesion-impairing metallic oxide of said metallic branding layer from said surface of said metallic branding layer so as to increase the surface area of available bonding sites for bonding said layer of branding ink to said surface of said metallic branding layer and thereby augment the effective adhesion energy between said surface of said metallic branding layer and said layer of branding ink, so as to enable said layer of branding ink to strongly adhere to said surface of said metallic branding layer, by introducing a chemical reducing ambient into said furnace and causing said chemical reducing agent to contact the surface of said metallic branding layer, so that said chemical reducing agent chemically combines with an oxide of said metallic branding layer to form a compound that is purged from the surface of said metallic branding layer, leaving the surface of said metallic branding layer substantially free of said oxide, thereby enabling a layer of branding ink to readily adhere to the resulting metallic oxide-free surface of said metallic branding layer.

11. A process according to claim 10, wherein said chemical reducing ambient includes hydrogen.

12. A process according to claim 10, wherein said chemical reducing ambient comprises a mixture of hydrogen and nitrogen.

13. A process according to claim 12, wherein said chemical reducing ambient comprises a gaseous mixture of nitrogen and ten percent or more of hydrogen.

14. A process according to claim 10, wherein step (b) comprises bringing the temperature of said furnace to a temperature in a range from 150° to 200° C. for a prescribed period of time.

15. A process according to claim 10, further including the step of
   after removal of said unwanted adhesion-impairing metallic oxide from the surface of said metallic layer in step (b), depositing a layer of branding ink on said surface of said metallic branding layer.

16. A process for treating a surface of patterned metal, on a printed circuit board on which electronic circuit packages are mountable, in preparation for the application of a layer of solder thereto comprising the steps of:
   prior to the application of said layer of solder onto the surface of said patterned metal,
   (a) placing said printed circuit board in a controlled ambient furnace; and
   (b) removing an unwanted adhesion-impairing metallic oxide from the surface of said patterned metal so as to increase the surface area of available bonding sites for bonding said layer of solder to said surface of patterned metal and thereby enhancing the effective adhesion energy between said surface of said patterned metal and said layer of solder, so as to enable said layer of solder to strongly adhere to said surface of said patterned metal, by introducing a hydrogen-containing reducing ambient into said furnace, thereby causing said reducing agent to contact the surface of said patterned metal, so that said reducing agent chemically reacts with a metallic oxide of said patterned metal to form water that is purged from the surface of said patterned metal, leaving the surface of said patterned metal substantially free of metallic oxide, thereby enabling solder to readily adhere to the resulting metallic oxide-free surface of said patterned metal.

17. A process according to claim 16, wherein said reducing ambient comprises a mixture of hydrogen and nitrogen.

18. A process according to claim 16, wherein said reducing ambient comprises a gaseous mixture of nitrogen and ten percent or more of hydrogen.

19. A process according to claim 16, wherein step (b) comprises causing said reducing agent to contact the surface of said patterned metal at an elevated temperature, so that said reducing agent chemically reacts with a metallic oxide of said patterned metal to form water that is purged from the surface of said patterned metal, and thereafter reducing the temperature of said patterned metal to room temperature in the presence of said ambient prior to removing said printed circuit board from said furnace.

20. A process according to claim 16, further including the step of:
   (c) after removal of said unwanted adhesion-impairing metallic oxide from the surface of said patterned metal in step (b), applying a layer of solder to the surface of said patterned metal.

* * * * *